(12) United States Patent
Street et al.

(10) Patent No.: US 6,429,417 B1
(45) Date of Patent: Aug. 6, 2002

(54) HIGHLY TRANSMISSIVE SENSOR FOR DETECTING THE POSITION OF AN OPTICAL SIGNAL

(75) Inventors: Robert A. Street, Palo Alto; Eric Peeters, Fremont; Michel A. Rosa, San Jose; Jeng Ping Lu, Mountain View; Christopher L. Chua, San Jose, all of CA (US)

(73) Assignee: Xerox Corporation, Stamford, CT (US)

( * ) Notice: Subject to any disclaimer, the term of this patent is extended or adjusted under 35 U.S.C. 154(b) by 104 days.

(21) Appl. No.: 09/708,808

(22) Filed: Nov. 8, 2000

(51) Int. Cl.[7] ................................................ H01L 27/00
(52) U.S. Cl. .................. 250/214.1; 250/208.1; 257/53; 257/464
(58) Field of Search ........................... 250/208.1, 214.1; 257/52, 53, 464

(56) References Cited

U.S. PATENT DOCUMENTS 6,163,313 A * 12/2000 Aroyan et al. ............ 178/18.04

* cited by examiner

*Primary Examiner*—Stephone Allen
*Assistant Examiner*—Bradford Hill
(74) *Attorney, Agent, or Firm*—Kent Chen (57) ABSTRACT

A system to align optical components is described. The system utilizes a highly transmissive sensor positioned in the optical path of an optical signal to determine the precise position of the optical signal. A feedback loop uses output from the highly transmissive sensor to readjust elements that maintains the optical signal in a desired position. The current system is particularly suitable for use in an optical cross switch.

18 Claims, 11 Drawing Sheets

HIGHLY TRANSMISSIVE SENSOR FOR DETECTING THE POSITION OF AN OPTICAL SIGNAL

BACKGROUND

Modern communications systems are shifting from electronic methods of transmitting data to high bandwidth optical communications systems. In order to improve efficiencies, such systems ideally utilize an optical switching system. An example of such a switching systems that switches an output of a fiber into one of several different fibers is described in U.S. Pat. No. 4,365,863 entitled "Optical Switch for a Very Large Number of Channels" issued to Broussaud et al. in December 1982 and hereby incorporated by reference.

One difficulty with optical systems is that alignment between optical components is critical. Minor deviations can cause signal loss, or improper,transmission of information. The problem is particularly acute in switching systems that propagate an optical signal over significant distances in free space before coupling the optical signal back into an optical fiber.

In order to improve alignment, various alignment techniques have been proposed. In one technique, a diverting device such as a mirror or beam splitter diverts a portion of the original optical beam or signal to a sensor. The system determines the expected position of the original optical beam or signal based on the relative orientation and position of the diverting device and the position of the diverted beam. A feedback loop transfers information from the sensor to mirrors or other apparatus to assure that the original optical beam remains properly aligned.

The described systems of using beam splitter has several disadvantages. A first disadvantage is increased system complexity. In particular, the described system requires diverting devices and careful positioning of components and sensors in relation to the diverting device. A second disadvantage is that the diverting devices typically divert a large percentage of the incident light reducing the signal strength of the original optical beam. The reduced optical signal strength decreases the signal to noise ratio and may increase the need for amplifiers to amplify the transmitted optical signal.

Thus an improved system for aligning optical components is needed.

BRIEF SUMMARY OF THE INVENTION

A highly transmissive sensor ideally suited for use in systems that require accurate alignment is described. The sensor includes a highly transmissive detector layer such as an amorphous silicon layer to detect incident optical signals. The amorphous silicon layer is deposited on a substrate that is highly transmissive to the optical signals being detected. Examples of such substrates include glass. In one embodiment, a substantially highly transmissive conducting plate serves as an electrode. Such conducting plates may be made from material such as Indium Tin Oxide (ITO).

DETAILED DESCRIPTION

Figure 1:
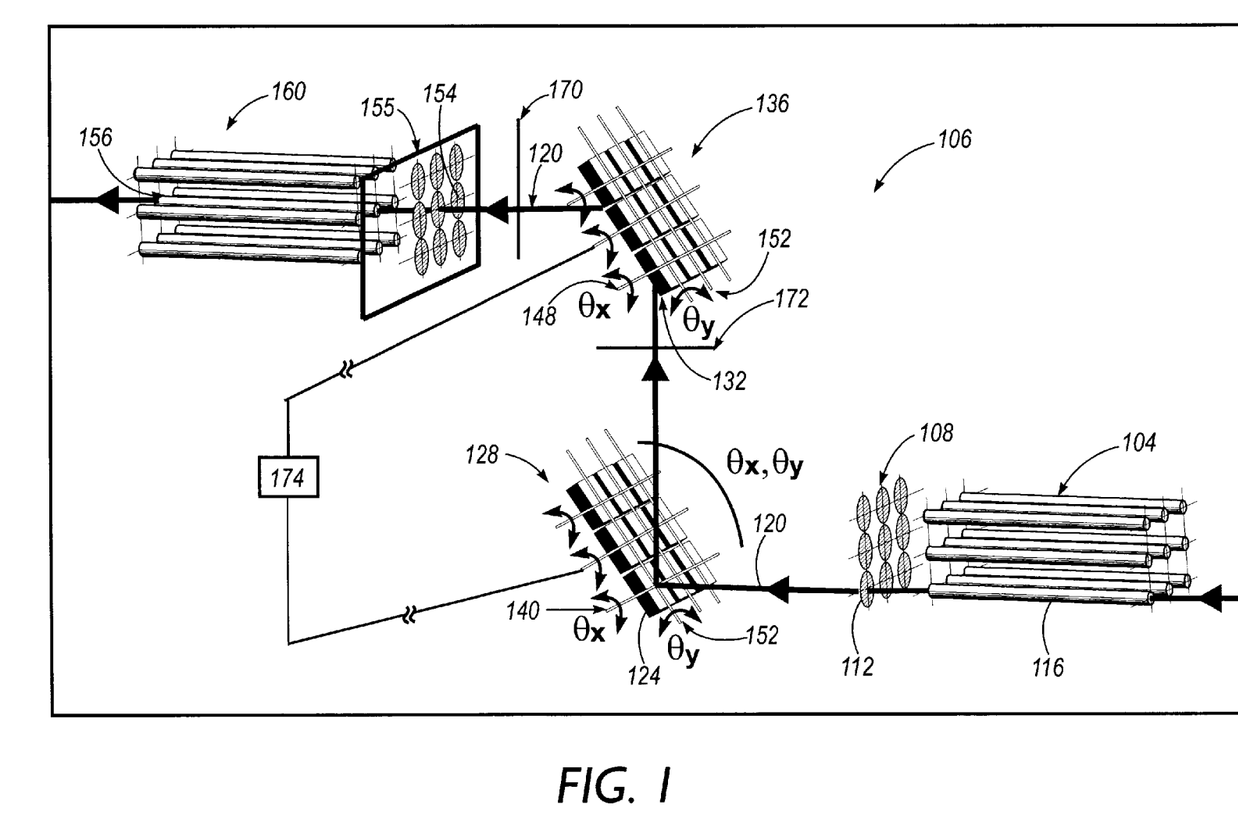
FIG. 1 shows a general structure of a cross-connect optical switch system including at least one highly transmissive sensor.

In the following description, a highly transmissive sensor that detects incident optical signals is described. The optical signals typically range between wavelengths of 600 nanometers (nm) and 1600 nm. FIG. 1 shows an example system using such a highly transmissive sensor. In FIG. 1, a group of output fibers 104 forming a i by j (ixj)matrix of fibers outputs optical signals to a cross switching system 106. A ixj lens array 108 focuses the output of each fiber for use by cross switching system 106. For example, lens 112 focuses and directs optical signals 120 output by a corresponding fiber 116 in the group of output fibers 104 to cross switching system 106.

One embodiment of cross switching system 106 includes two arrays of moveable mirrors. Although mirrors are used in this specification to facilitate understanding, it is to be understood that other beam deflecting or light guiding apparatus may be used. For example, moving lenses and grating light valves produced by Silicon Light Machines of Sunnyvale Calif., recently acquired by Cypress of San Jose, Calif. may be substituted for the mirrors. Each mirror in the two arrays of moveable mirrors may be rotated to redirect the path of an incident optical signal. For example, first mirror 124 in first mirror array 128 directs optical signal 120 to a second mirror 132 in second mirror array 136. First mirror 124 rotates around both a x axis of rotation 140 and a y axis of rotation 144 to direct optical signal 120 to a desired angle of incidence on a second mirror 132. Likewise, second mirror 132 rotates along a corresponding x axis of rotation 148 or a corresponding y axis of rotation 152 to direct optical signal 120 to a selected lens 154 in receiving lens array 155. Selected lenses focus received optical signals on corresponding optical fibers. For example, lens 154 focuses optical signal 120 on a corresponding receiving fiber 156 in receiving fiber array 160.

An alternate embodiment of a cross switch implemented by Lucent Technologies substitutes a single fixed mirror and one array of moveable mirrors for the previously described two arrays of moveable mirrors. In such an alternate embodiment, a first mirror in the array of moveable mirror reflects light to the fixed mirror. The fixed mirror directs the light back to a second mirror in the array of moveable mirrors. The second mirror rotates directing the optical signal to a lens or other designated receiving component of an optical system.

A variety of methods may be used to control the rotation of the mirrors and assure that alignment directs the output of the mirror to the selected lens and/or receiving fiber. Typically, each mirror is a MEMS mirror that is controllable by applying electrical signals to the mirrors. Such mirrors are described by the patent application entitled "Structure for an Optical Switch on a Glass Substrate" filed Sep. 28, 2000 and assigned to Xerox Corporation, and hereby incorporated by reference.

One problem with the described cross system is that each mirror has a corresponding tilt angle that must be very precisely aligned. One method of determining the position of mirrors is to place strain gauges along elements that control mirror movements. The deformation of the strain gauges indicates the position of the mirror. Control electronics (not shown) may use the information to properly orient the mirrors. However such strain gauges are difficult to manufacture and align. Furthermore, such strain gauges cannot be used to compensate for shifts of the mirror array with respect to the lens array or the fiber array because the reference point of the strain gauge is the mirror substrate. Shifts or movements of the mirror substrate with respect to the lens array may occur due to temperature variations.

A second method of aligning the mirrors may use a LED or other light source to reflect light at an oblique angle from the mirrors into an opaque detector, such as a charge coupled device (CCD) sensor camera. However, such a system also requires precise alignment of mirrors with respect to the sensor and the receiving fiber.

In order to avoid long optical paths and a need for a beam splitter, a highly transmissive sensor 170 is placed along the optical path of light reflected from second mirror array 136. The light beam passes through the sensor, and the sensor is configured so that the position of the beam can be precisely determined. The angle of the mirror is then adjusted to bring the beam to the correct position. In some embodiments of the invention, it is also desirable to include a second sensor 172 between the first mirror array 128 and the second mirror array 136 to facilitate controlling the tilt angles of mirrors in first mirror array 128. Controlling the tilt angles of mirrors in first mirror array 128 assures a proper incidence position and angle of light on a corresponding mirror in second mirror array 136. Highly transmissive sensor 170 and highly transmissive sensor 172 detect the position of incident light and feedback electronics 174 uses the information to correct the position of mirrors in first mirror array 128 and second mirror array 136. In particular, the feedback electronics 174 assure that each optical signal being transmitted is centered on a corresponding lens in lens array 155. The lens directs the incident optical signal to the corresponding fiber in fiber bundle 160.

Figure 16:
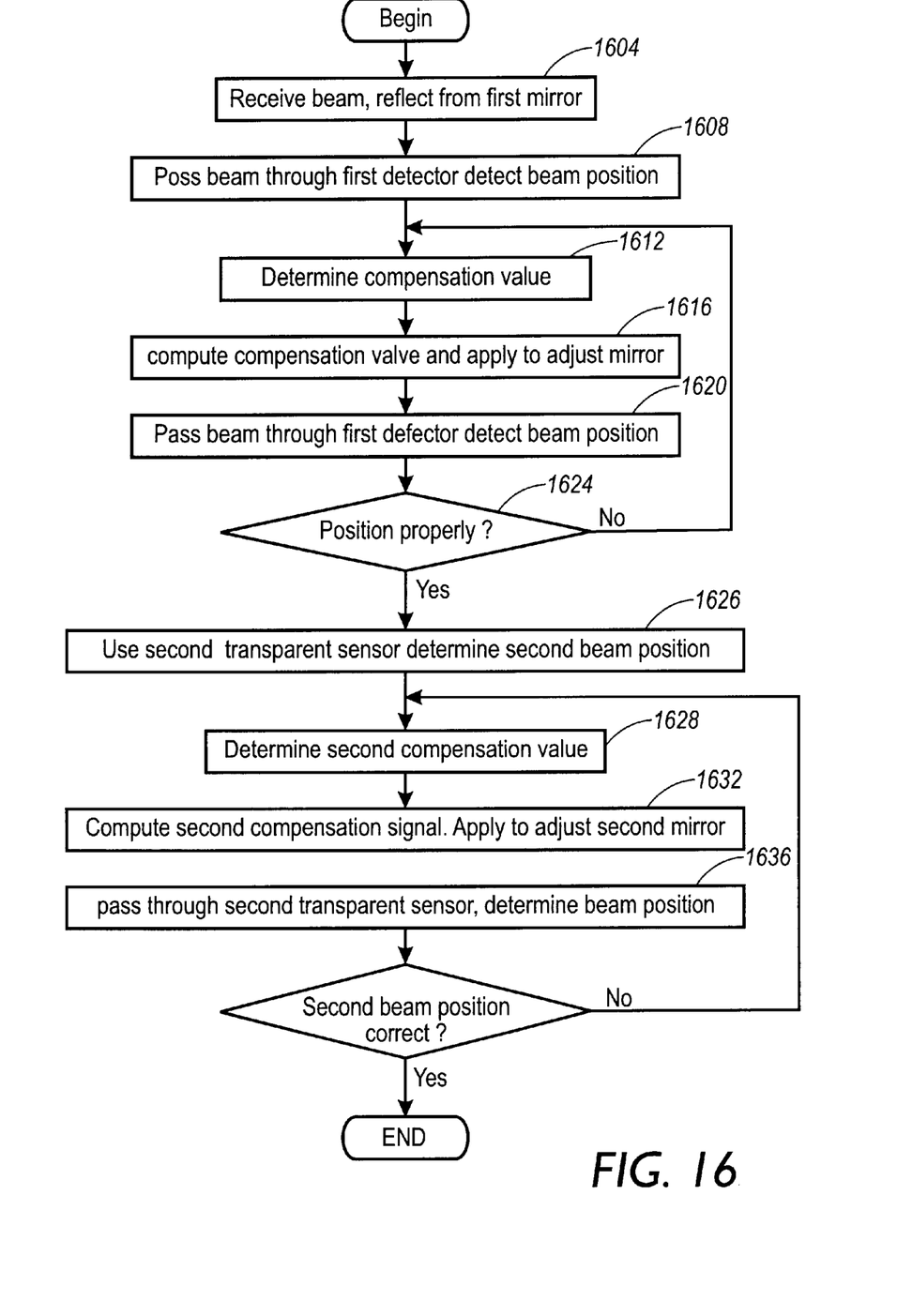
FIG. 16 is a flow chart that shows operation of the cross switch of FIG. 1.

FIG. 16 is a flow chart that describes operation of the system of FIG. 1. In block 1604, the cross switch receives an optical beam. The beam is reflected from the first mirror array through a first highly transmissive sensor positioned in close proximity to the second mirror array. The first highly transmissive sensor detects the position of the optical beam in block 1608. In block 1612, processing electronics determines a compensation value. The compensation value is a function of the position determined by the highly transmissive sensor and the desired position or "target position" such that the optical beam is incident on a selected second mirror in the second mirror array. In one embodiment of the invention, each fiber in the receiving fiber bundle corresponds to a mirror in the second mirror array, thus the corresponding second mirror position and or target position is determined by which fiber should receive the signal from the first mirror array.

In block 1616, a compensation signal is determined from the compensation value. The compensation signal is set to adjust the mirror, in both an x tilt and a y tilt to cause the optical beam to arrive at the target position. The compensation signal is applied to actuators or MEMS that control the mirror tilt to readjust mirror orientation and thereby redirect the beam to the target position. After repositioning of the mirror, the first highly transmissive sensor again determines the beam position in block 1620. When in block 1624, the first highly transmissive sensor determines that the beam is not properly positioned, blocks 1612 to 1620 are repeated to further correct mirror orientation.

When in block 1624, the system determines that the light beam is properly incident on a second mirror in the second mirror array, the second highly transmissive sensor detects the position of the beam reflected from the second mirror in block 1626. Typically, the second highly transmissive sensor is positioned in close proximity to a lens that focuses light from the lens into the selected fiber optical line. The close proximity assures that the position of the optical beam at the second highly transmissive sensor closely corresponds to the beam position at the lens array.

In block 1628, processing electronics determine a second compensating value based on the desired position of the beam at the lens array and the actual position of the beam. Because it is known which fiber should receive the signal, and because of a one to one correspondence between each lens in the lens array and each fiber, it is also known which lens should receive the signal. The position of the lens is known, and thus the desired position is also known. The highly transmissive sensor provides the actual position of the beam.

In block 1632, the second compensation value is used to generate a second compensation signal that is applied to actuators or MEMS devices. The actuators tilt the second mirror to move the optical signal to a new position.

After moving the optical signal to the new position, the second highly transmissive sensor again measures the beam position in block 1636. When in block 1640, it is determined that the new position does not match the desired position, blocks 1628 to 1640 are repeated to further adjust the tilt of the second mirror. The procedure is repeated until the circuit determines in block 1640 that the beam is properly positioned at the lens.

The sensor comprises a thin film semiconductor with suitable metal contacts, deposited on a substrate, in which each layer is substantially highly transmissive to the optical beam. The preferred embodiment uses hydrogenated amorphous silicon (a-Si:H) as the semiconductor which is known to make sensitive detectors and is substantially transparent at the wavelengths of interest. However other photoconductive materials with a bandgap above 0.8 eV (1.55 micrometers) or 0.95 eV (1.3 micrometers) may be used. Examples of such materials include but are not limited to alloys of a-Si:H, for example with Ge, organic photoconductors (for example benzimidazole perylene, poly (3-hexyl thiophene) P3ht), polycrystalline silicon, a-Ge, and others. Examples of typical highly transmissive metal conductors include indium tin oxide (ITO) or alternatively zinc oxide. Typical substrate materials include glass or a plastic.

As used herein, "highly transmissive" or "transparent" as used to described sensor 170 means that substantially all the light of the optical signal passes through sensor 170. In reality, a small percentage of photons are absorbed to generate carriers in the sensor. The percentage of photons absorbed in the amorphous silicon layer and in the ITO layer that serves as conducting plates is typically less than 1–2 percent. For example, at 1.55 micrometer wavelengths, a one micrometer thick layer of a-Si, absorbs less than 0.1 percent of the incident photons. A 100 nm thick layer of ITO typically absorbs between 0.1 and 0.5 percent of the incident photons.

More substantial losses may result from photons lost due to reflections from the sensor surface. In an unoptimized case where the thickness of an ITO layer that serves as a conducting plate is half the wavelength of the incident light, the percentage of light reflected can approach 60 percent. Such a high percentage of loss is unacceptable. However, such loss can be significantly reduced. For example, by optimizing the thickness of ITO layers to one quarter of the wavelength of incident light, and the amorphous silicon layer to approximately three and a half wavelengths of incident light, the percentage of reflected light can be reduced to 1.7 percent at the optimized wavelength. In a typical optimized case in which the incident light has a wavelength of 1.55 micrometers, the ITO layers will be formed to have a thickness of 258 nm and the amorphous silicon will have a thickness of 1,560 nm. In order to minimize losses due to reflectivity, some embodiments of the invention includes the use of additional antireflection coatings deposited on the sensor or the substrate. The use and fabrication of anti-reflection coatings are well-known in the art.

In one embodiment of the invention, the total percentage of photons absorbed or reflected is less than 10% thereby allowing at least 90% of the optical signal which ranges in wavelength between 1.3 micrometers and 1.55 micrometers to pass through the sensor structure. In optimized systems, the percentage of photons absorbed or reflected is further reduced to 5% thereby allowing 95% of the incident optical signal to pass through the highly transmissive sensor. The particular wavelengths described are typically what is used in optical communications systems, although other wavelengths that generate small numbers of carriers in amorphous silicon may also be used. As the wavelength decreases, approaching the lower end of communication frequencies, absorption within the sensor will typically increase.

Figure 9:
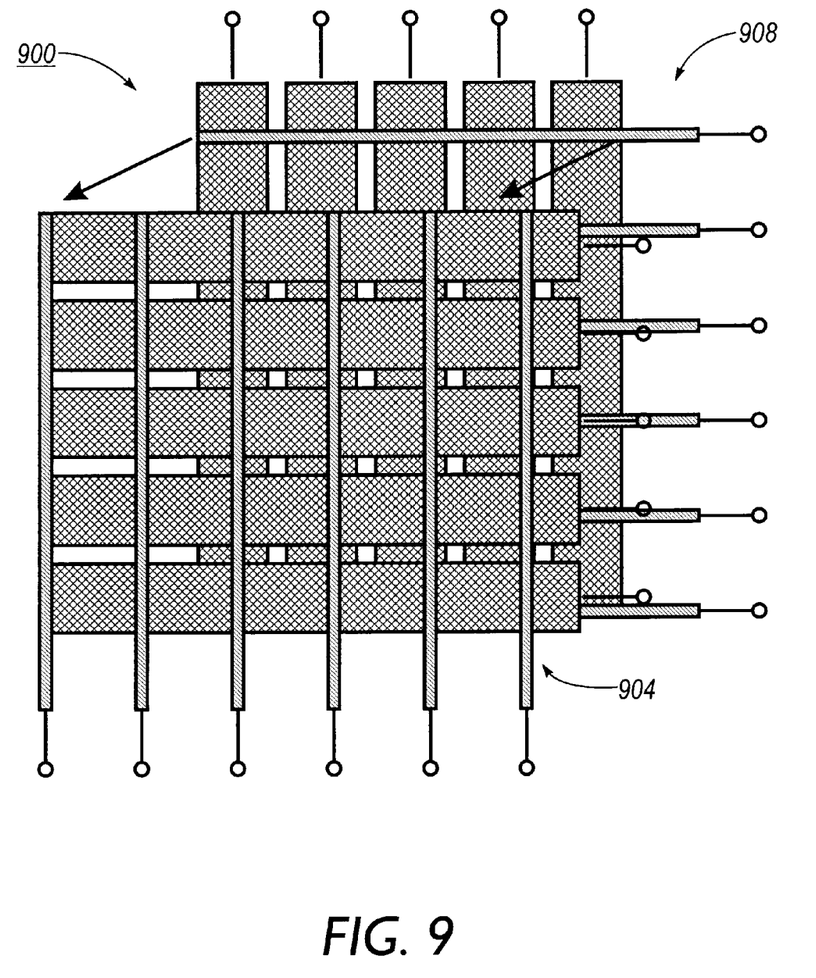
FIG. 9. shows a top view of a sensor structure that includes two segmented conducted layers oriented at a perpendicular orientation.
Figure 10:
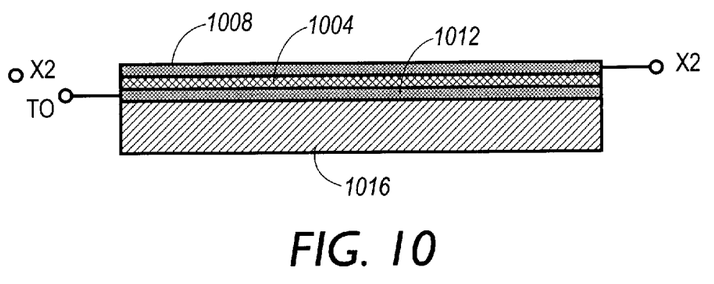
FIG. 10 shows a side view of a highly transmissive intensity sensor for aligning a light beam.
Figure 11:
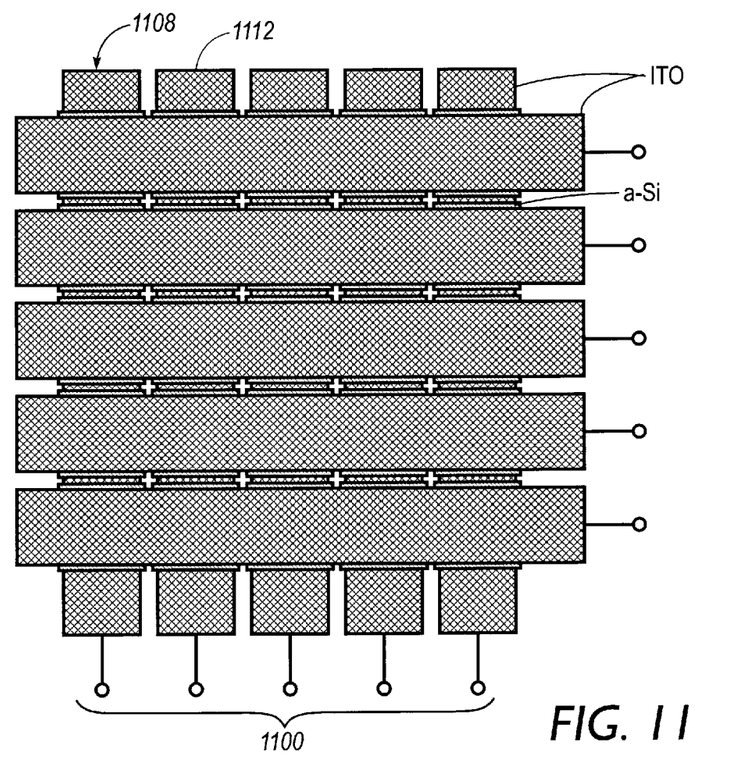
FIG. 11 shows a top view of a highly transmissive intensity sensor for aligning a light beam.
Figure 12:
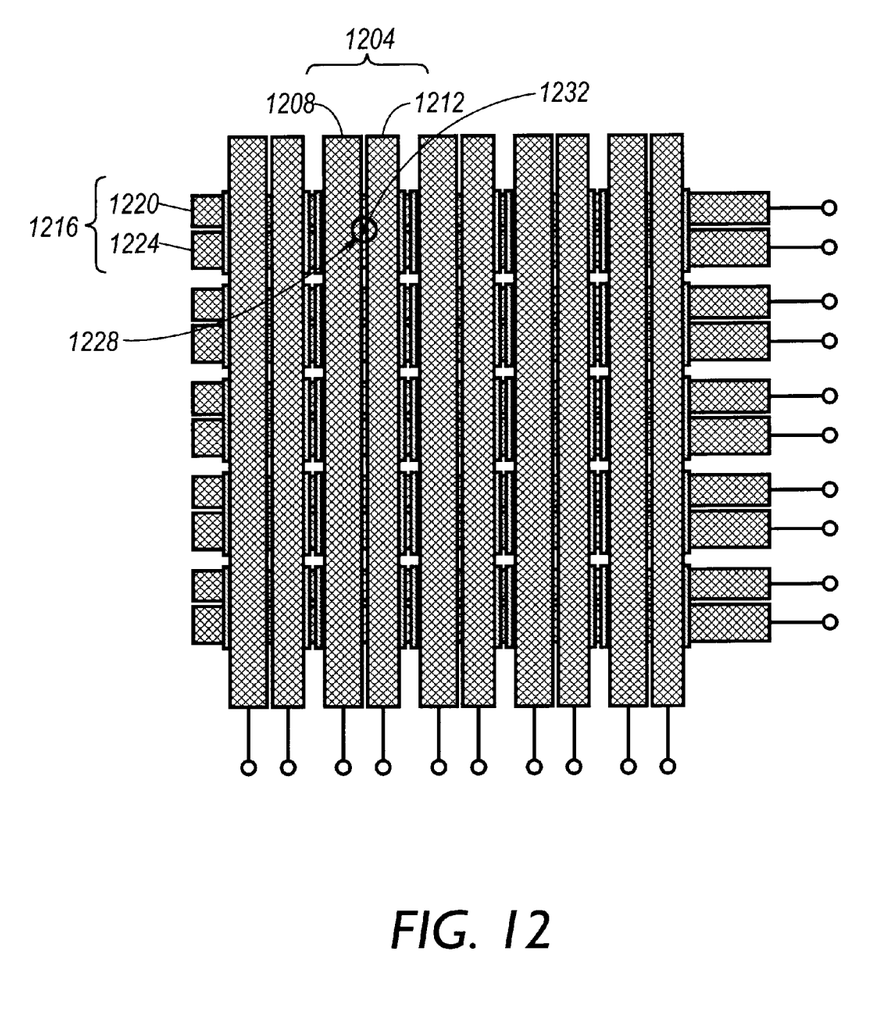
FIG. 12 shows a top view of a highly transmissive intensity sensor that uses closely spaced parallel strips to center an incident optical signal.
Figure 13:
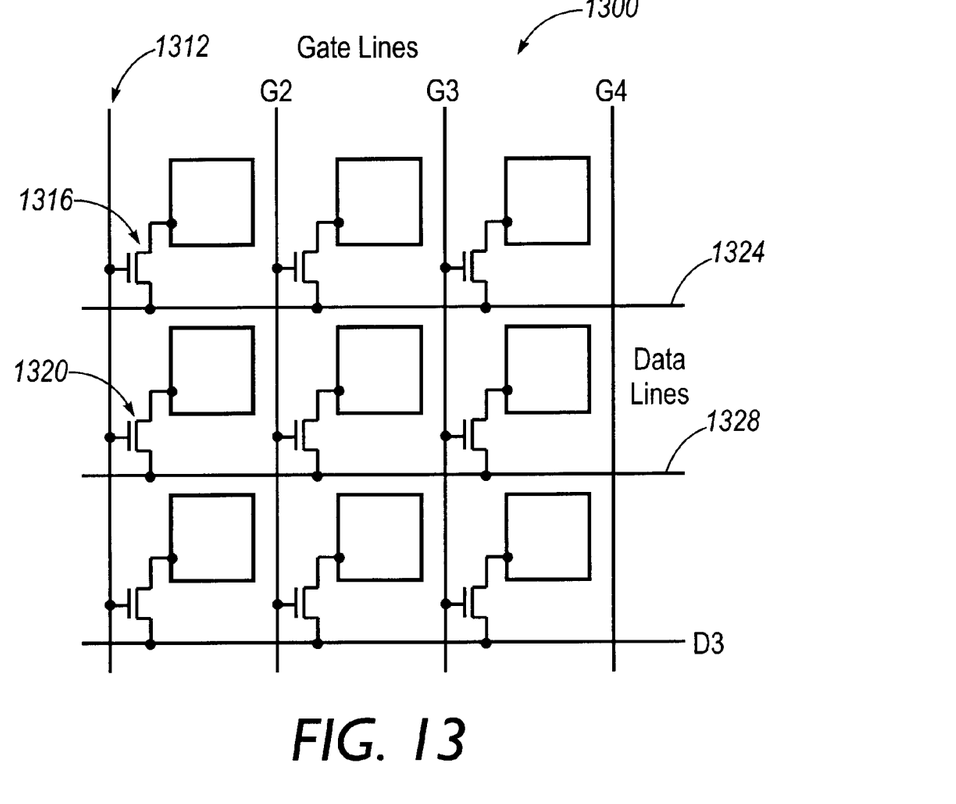
FIG. 13 shows a top view of an active matrix image sensor.
Figure 14:
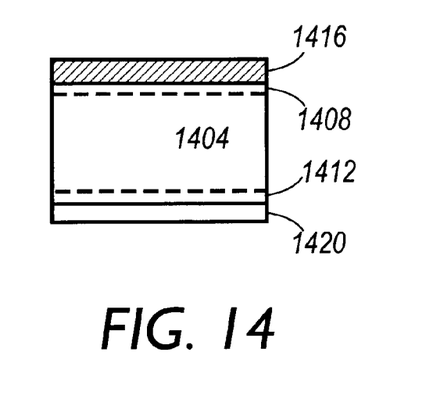
FIG. 14. shows a side view of a pixel in the active matrix image sensor of FIG. 13.

For the specific problem of sensing the position of many beams of light from a cross switch array, several different designs will work, and the preferred embodiment depends on the number of beams, the speed at which sensing is needed and other parameters of the optical system. We describe three alternative sensor configurations. FIGS. 2–9 show various embodiments of position sensitive detectors; FIGS. 10–12 show intensity sensors shaped to the specific dimensions of the beams; and FIGS. 13–14 shows a pixelated sensor array with many more pixels than optical beams.

Figure 2:
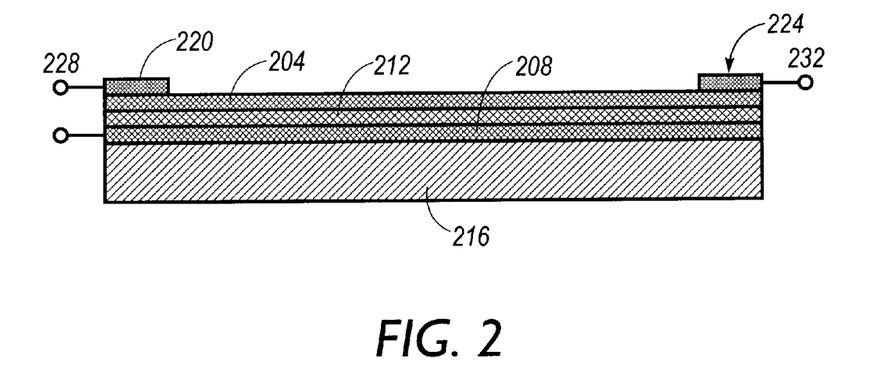
FIG. 2 shows a simplified schematic view of a cross-sectional side view of an amorphous silicon position sensitive detector (PSD).

FIG. 2 shows a cross section of one embodiment of highly transmissive sensor 170. In FIG. 2, a pair of highly transmissive collector plates, including top collector plate 204 and bottom collector plate 208 sandwiches a sensor medium 212. In one embodiment of the invention, the sensor medium is amorphous silicon that forms an a-Si:H structure. Collector plates 204, 208 may be made from a variety of highly transmissive conductors. In the illustrated embodiment, an indium tin oxide (ITO) material forms collector plates 204, 208. The combination sensor medium 212 and collector plates 204, 208 form a p-i-n diode structure with a thickness of approximately one to five microns. In an alternate embodiment, a Schottky diode structure may also be used.

A highly transmissive substrate 216, such as glass, supports collector plates 204, 208 and sensor layer 212. The transparency of collector plates 204, 208, sensor layer 212 and substrate 216 allows incident light signals to pass through the highly transmissive sensor with minimal attenuation. Electrode strips 220, 224 along the edge of collector plate 204 collect charge generated in the a-Si-layer. The electrode strips are typically composed of an opaque conducting material such as metal.

The described structure enables high charge collection at a low bias voltage. The sensor dark leakage current at 300K is about $10^{-11}$ A/Cm$^2$. When an optical signal, typically generated by a laser beam, hits the a-Si sensor, a small percentage of the photons are absorbed. The absorbed photons generate local carriers. In a sensor that uses a one or two micron thick amorphous silicon layer sandwiched between ITO collector plates 204, 208, a one milli-Watt laser beam in the frequency range of 1.55 micrometers generates a current of about $10^{-8}$ Amperes.

The bias applied to the sensor medium causes the carriers to travel a short distance through the sensor medium to ITO collector plates 204, 208. ITO collector plates 204, 208 transport the generated local carriers to edge electrode strips 220, 224. Each electrode strip 220, 224 is coupled to a corresponding terminal 228, 232. The ratio of charge collected at terminal 228 to the charge collected at terminal 232 is a measure of the lateral position (x coordinate) of the center or centroid of an incident beam of optical energy. The determined information may be used to provide position feedback for the MEMS mirrors illustrated in FIG. 1. The control loop would maintain the position of the output of the MEMS mirrors as close to possible to an x coordinate in a calibration table.

When used in a MEMS mirror system, an initial calibration might be set at a manufacturer. When highly transmissive sensor 155 of FIG. 1 is mounted in close to or against the lens array, the correlation between lens position and sensor position should not change over time. In actual use, each mirror actuator could be recalibrated every few minutes or after activation or movement of a mirror to a new tilt angle.

Figure 3:
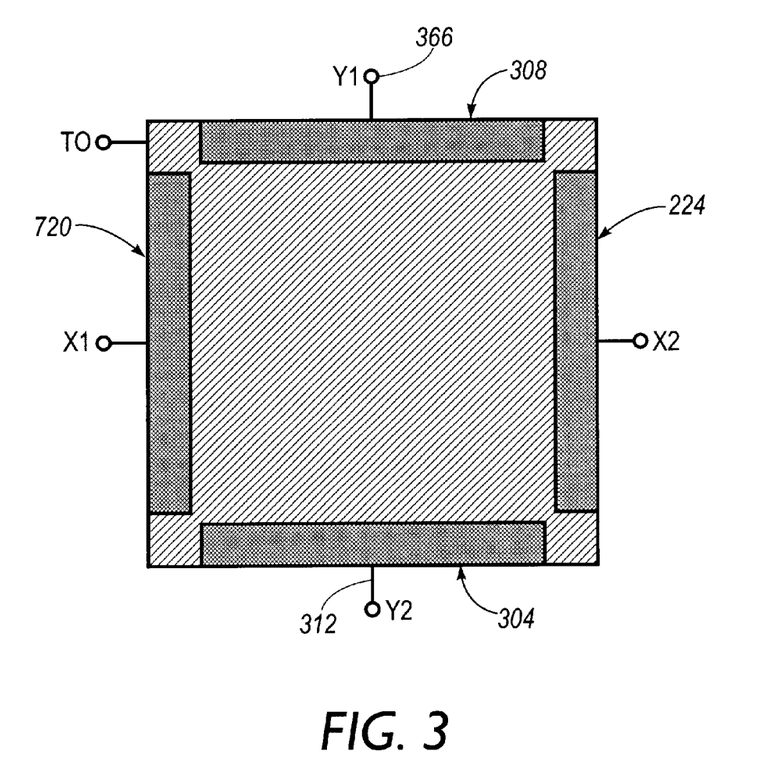
FIG. 3 shows a top view of an amorphous silicon position sensitive detector (PSD).

FIG. 3 shows a top view of the sensor structure illustrated in FIG. 2. In FIG. 3, electrode strips 304, 308 oriented perpendicularly to electrode strips 220, 224 determine the position of the optical signal along a Y axis. In particular, electrode strips 304, 308 provide charge to corresponding terminals 312, 316. The ratio of charge collected at each electrode indicates the centroid of the incident optical beam along the y direction.

The simple structure of FIG. 3 has several problems. A first problem is that when multiple beams are incident on the sensor, a method of distinguishing different beams is needed. One method of distinguishing the beams is to modulate the position of the beam being detected by actuating a mirror such as mirror 124 in a predetermined pattern such as a sine wave at a selected frequency. A frequency filter in the sensor readout passes sensor signals at the selected frequency enabling determination of the modulated beam position. However, noise introduced by multiple beams limits the scalability of the described approach.

Figure 4:
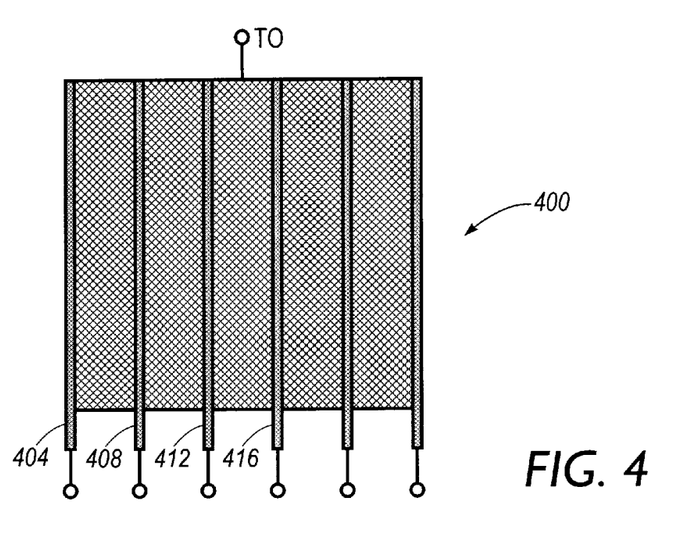
FIG. 4 shows a top view of a PSD that segments sensors into strips to improve common mode rejection.
Figure 5:
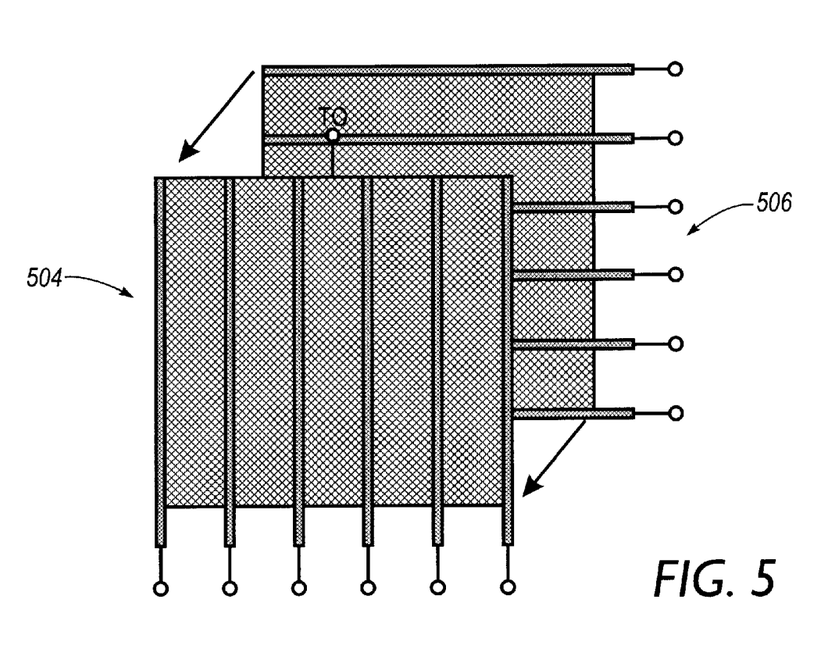
FIG. 5 shows combining two segmented sensors to improve sensing in two dimensions, including an x direction and a y direction.

Another method of improving the signal to noise ratio involves increasing the amorphous silicon absorption of photons by adding an alloying material such as germanium to the amorphous silicon. However, the increased absorption also reduces the "transparency" of the sensor. A better method of improving the signal to noise ratio is to replace a single large sensor with an array of smaller sensors or pixilating the large sensor. The signal to noise ratio of a sensor is inversely related to the size of the sensor, thus an array of small sensors reduced the noise generated. FIGS. 4–10 will show methods of segmenting or pixelating a single large highly transmissive sensor in order to maintain maximum transparency while maintaining a reasonable signal to noise ratio, FIG. 4 shows a top view of a sensor 400 that uses metal electrodes 404, 408, 412, 416 oriented along an axis such as the Y axis to improve common mode rejection and enhance position sensing in a single direction. FIG. 5 shows combining two such highly transmissive sensors, a first sensor 504 having metal electrodes that are perpendicularly oriented to metal electrodes in second sensor 506. The two sets of perpendicular electrodes allow improved position sensing along both the x direction and the y direction. In particular, first sensor 504 determines position of incident optical signals along an x axis while second sensor 506 determines the position along a y axis.

Figure 6:
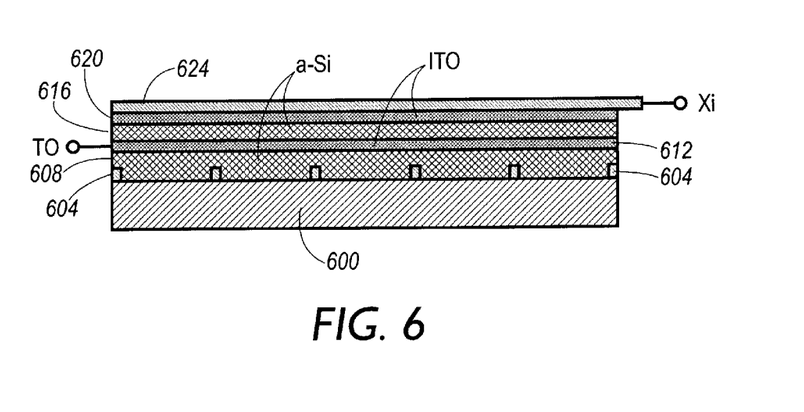
FIG. 6 shows a side view of a multi-level row-column sensor on a single highly transmissive substrate.
Figure 7:
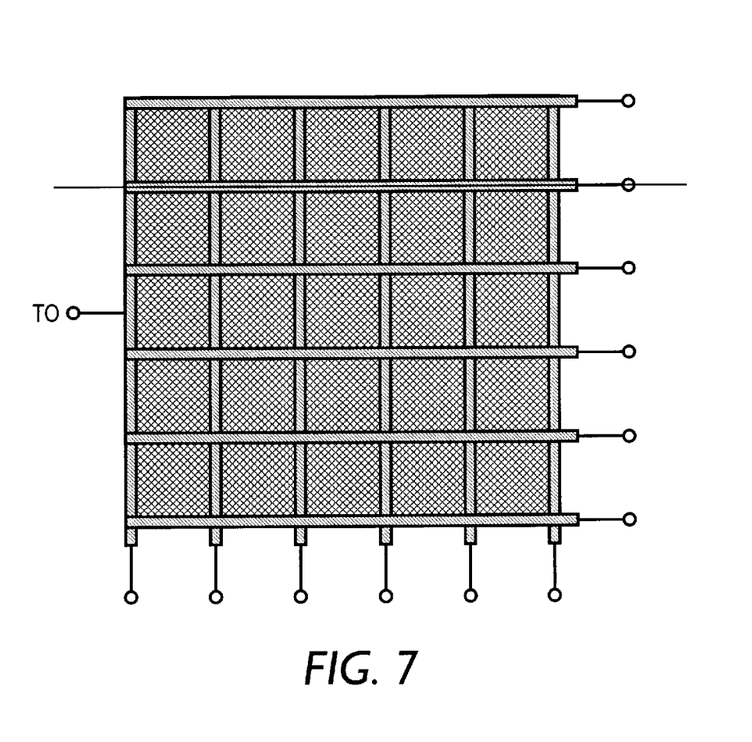
FIG. 7 shows a top view of a: multi-level row-column sensor on a single highly transmissive substrate.

FIG. 6 illustrates a side view cross section and FIG. 7 illustrates a top view of a multi-level row-column sensor on a single highly transmissive substrate 600. The structure shown in FIG. 6 and FIG. 7 replaces the adjacent or "back to back" sensors of FIG. 5 in a single sensor structure on a common highly transmissive substrate 600.

In FIG. 6, highly transmissive substrate 600 supports parallel conducting, typically metal electrodes 604 running along a first direction, such as along an x direction. A first layer of amorphous silicon 608 is deposited over metal electrodes 604. In one embodiment of the invention, an ITO layer (not shown) serves as a conducting plate between the amorphous silicon and the metal electrode. Alternately, a layer of amorphous silicon near the metal electrodes 604 may be heavily doped to form the conducting layer. In response to an incident light beam, first layer 608 generates a carrier cloud. A highly transmissive conducting plate 612 provides a bias potential to drive carriers generated by the incident light beam to a conducting region such as an ITO layer (not shown) or a heavily doped region of amorphous silicon. The conducting region conducts the carriers to the nearest metal electrodes 604. The ratio of carriers reaching each metal electrode of metal electrodes 604 indicates the approximate y coordinate of the incident light beam.

In the illustrated embodiment, a second amorphous silicon layer 616 is deposited over conducting plate 612. When an incident light beam passes through amorphous silicon layer 616, a carrier cloud is generated in second amorphous silicon layer 616. A voltage potential difference across the amorphous silicon layer 616 drives the carriers to a second conducting plate 620. Conducting plate 620 transports the carriers to the nearest electrode in a second array of metal electrodes 624. The electrodes transmit the carriers to sensing electronics (not shown).

FIG. 7 shows that the second array of metal electrodes 624 is perpendicularly oriented with respect to the first array of metal electrodes 604. Thus, when metal electrodes 604 are oriented along an x direction, metal electrodes 624 are oriented along a y direction. The ratio of carriers received by each electrode of the second array of metal electrodes 624 is used to determine the position of the light beam along an x direction.

Figure 8:
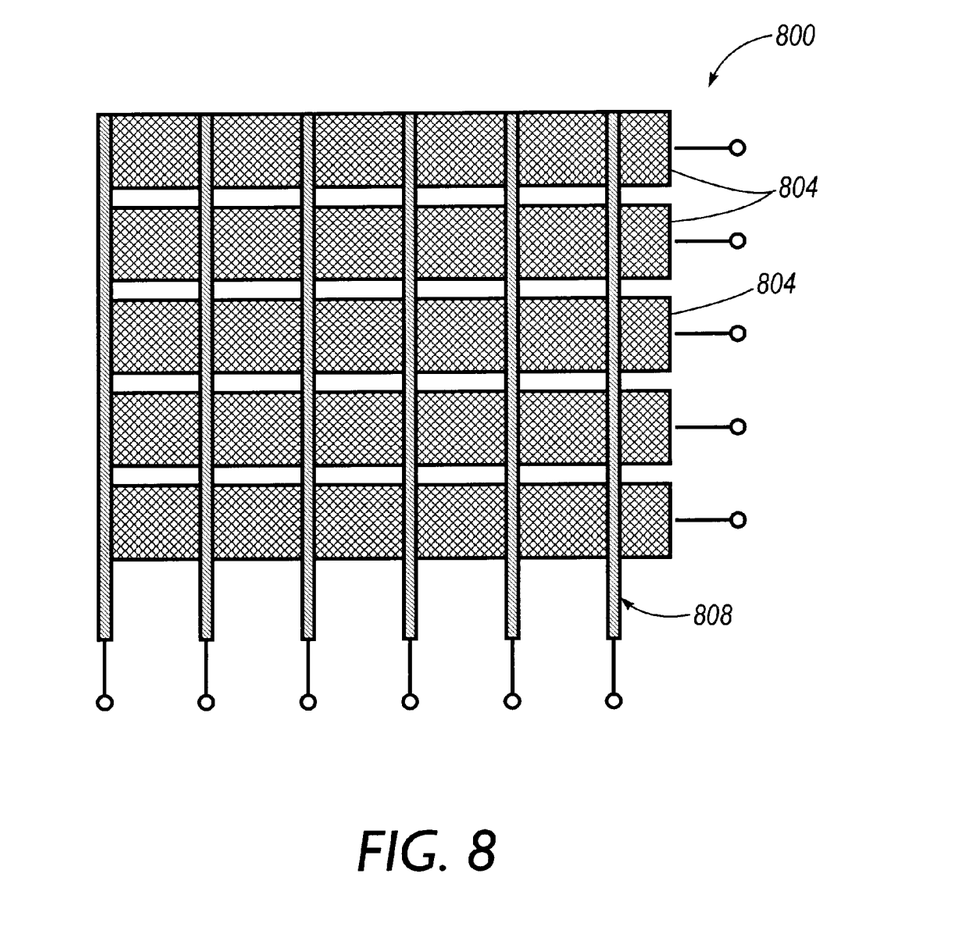
FIG. 8 shows a top view of a sensor structure that segments the conducting layer that serves as a common electrode.

FIG. 8 illustrates a top view of a sensor structure 800 that segments the conducting layer that serves as a common electrode 804 (as well as amorphous silicon and corresponding ITO) layers. Segmenting common electrode 804 allows biasing to be applied such that when metal electrode 808 detects current, the current is associated with only a specific area of the sensor. In order to allow two dimensional positioning of a carrier cloud, sensor structure 800 of FIG. 8 may be repeated in a two layer structure as illustrated in FIG. 9. In FIG. 9, the electrodes in a first layer 904 and the electrodes in a second layer 908 are perpendicularly oriented. The perpendicular orientation allows determination of the position of an incident optical beam 912 in both the x and the y direction. The use of the illustrated configuration avoids the need for accurate mechanical positioning of the sensor with respect to the lenses or fibers 160 of FIG. 1 because calibration of the sensor with respect to each fiber may be accomplished after the position of the sensor and fibers 160 are fixed.

FIG. 10 illustrates a side view and FIG. 11 illustrates a top view of a highly transmissive intensity sensor 1000 for alignment of the light beam from the optical switch 106 of FIG. 1 with the lens array 154. The intensity sensor includes a highly transmissive sensing layer 1004, typically amorphous silicon, positioned between a first highly transmissive conducting layer 1008 and a second highly transmissive conducting layer 1012. The sensor structure is supported by highly transmissive substrate 1016.

FIG. 11 shows a top view of intensity sensor 1000 that includes two layers 1100, 1104. Each layer is divided into a series of parallel strips of amorphous silicon (and conducting layer) such as parallel strips 1108, 1112 of first layer 1100. The width of the strips is approximately matched to the diameter of the beam at the sensor such that sensor output is maximized when the beam directly overlaps the amorphous silicon in a strip. Thus sensor electronics can determine when the beam is properly aligned. In a typical optical switch system, the width of a strip is between 500 and 5000 micrometers.

In order to facilitate position determination in two dimensions, the parallel strips of second layer 1104 are oriented perpendicularly to the parallel strips of first layer 1100. As described, the width of each strip is preferably approximately equal to the width of the incident light beam. The signal generated by the sensor is maximum when the center or centroid of the beam is aligned with the center of an intersection of strips in first layer 1100 and second layer 1104. The signal decreases when the optical light beam intersects regions between parallel strips in either first layer 1100 and second layer 1104. By positing the intersection of strips with the center of each lens in lens array 154, a feedback signal can be generated to facilitate alignment of the beam with a corresponding lens.

Even when the beam width is not matched with the strip width, alignment may be achieved by applying a sinusoidal or other periodic actuation with a predetermined frequency to a mirror such as mirror 152 in mirror array 136. When the center of the beam movement coincides with the center of the intersection between parallel strips in first layer 1100 and second layer 1104, the amplitude of the sensor output signal has a frequency double that of the predetermined frequency.

FIG. 12 shows an alternative structure that uses an intensity measurement for centering a beam over the lens. The structure of FIG. 12 allows the width of parallel strips such as strips 1108, 1112 to be substantially different from the width of the beam. In FIG. 12, each sensor strip such as sensor strip 1204 is divided into two parts such as first half 1208 and second half 1212. A narrow insulating region separates first half 1208 and second half 1212. Similarly, perpendicular sensor strip 1216 is divided into two parts 1220, 1224. When a light beam 1228 is properly centered on the intersection 1232 of sensor strip 1204 and perpendicular sensor strip 1216, approximately half the light beam is incident on the first half 1208 of sensor strip 1204 and another half of the light beam is incident on the second half 1212 of sensor strip 1204. Thus the current in first half 1208 will approximately match the current in second half 1212. Likewise, the current in part 1220 will match the current in part 1224. Using current subtraction or "nulling" to determine when the currents in each half match, the incident light beam can be centered between each half. In the event that intersection 1232 is not aligned with an underlying object such as the center of a lens in lens array 154, a calibration table may be used to specify the desirable current ratios that occur in each half strip when the beam is aligned with a lens center.

FIG. 13 shows a pixellated sensor 1300 array that has more pixels 1304, 1308 than there are light beams. A side view of each pixel is shown in FIG. 14. Each pixel includes an intrinsic amorphous layer 1404 that serves as a sensor medium. A top portions 1408 maybe p doped and a bottom portion 1412 may be n doped to provide a junction for the application of a bias voltage. A top highly transmissive conductor 1416 applies a bias voltage that causes carriers generated by incident light to be moved to a bottom highly transmissive conductor 1420.

Returning to FIG. 13, a gate line controls the readout of the data on each pixel such as pixel 1304, 1308. In the illustrated embodiment, gate line 1312 controls the gate of a transistor such as transistors 1316, 1320. When a voltage is applied to gate line 1312, the contents of pixels such as pixel 1304, 1308 can be read by electronics coupled to corresponding data lines 1324, 1328. Electronics can use the data from the data lines to determine the position of the beam and transmit signals to correct the tilt of the mirrors.

The size of the pixels may be determined by the beam size being detected. For example a 512×512 pixel array with 50–75 micron pixel size has about the correct dimension to determine the position of a light beam of 200–500 micron width. The beam fills many pixels and the response from all of the illuminated pixels can be used to locate the centroid of each beam with much greater accuracy than the pixel size. To avoid cross-talk between beams, the beams should not overlap in any one pixel. Such cross-talk can be avoided by setting the pixel size much smaller than the beam size.

As previously described, these arrays can be made highly transmissive by using ITO for the top and bottom contacts and amorphous silicon as the sensor, as described above. Information in the sensor may be read out using active matrix addressing as previously described. Using active matrix addressing allows multiple pixels to be read out simultaneously which permits faster responses time compared to passive matrix addressing systems that use a sequential readout procedure. Typically, the metal address lines, including both the gate lines and the data lines illustrated in FIG. 13 are small enough not to attenuate the beam significantly However, in cases where maximum transparency is desired, the gate lines and the address lines could also be made with ITO.

Figure 15:
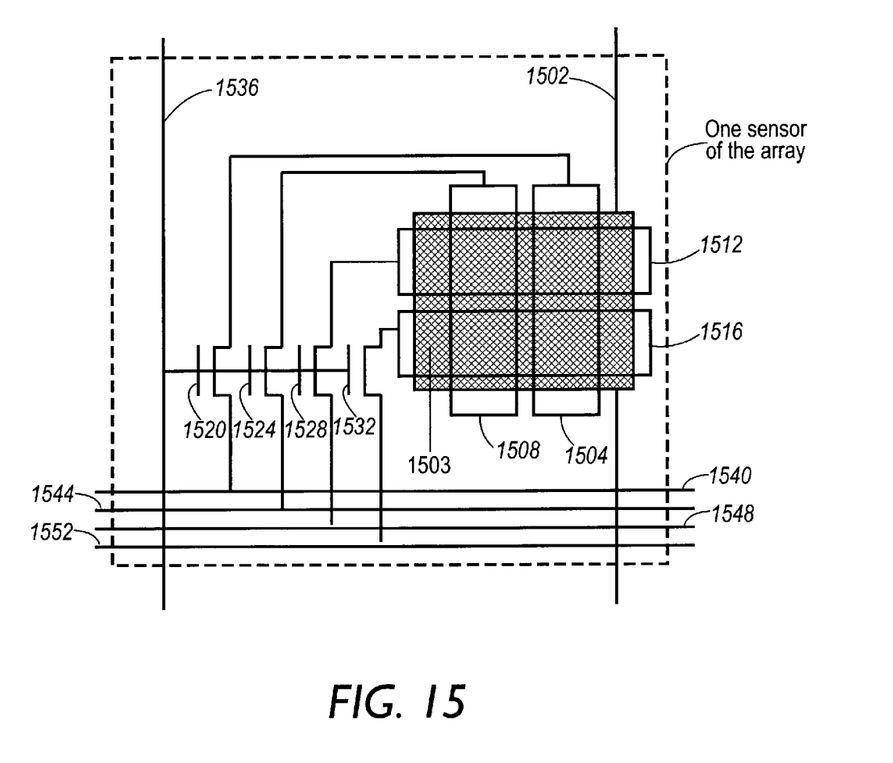
FIG. 15 shows one method of matrix addressing a split sensor.

Another method of reading out data from an intensity sensor such as the split sensor of FIG. 12 is shown in FIG. 15. In FIG. 15, a bias line 1502 provides a bias to a conducting layer adjacent to a sensor medium 1503. A series of electrode strips 1504, 1508, 1512, 1516 that receive carriers generated in sensor medium 1503 is coupled to corresponding thin film transistors 1520, 1524, 1528, 1532.

When a read out of the sensor is needed, a voltage is applied to common gate line 1536. The voltage of common gate line 1536 is received at the gates of thin film transistors (TFTs) 1520, 1524, 1528, 1532. An asserted voltage turns on the corresponding TFTs. When turned on, the voltage generated by each electrode can be detected on output read lines 1540, 1544, 1548, 1552. Processing electronics attached to the output read lines processes the output signal to determine the position of a light beam incident on the sensor.

The preceding description has included details such as example dimensions, materials and systems in which a highly transmissive sensor can be used. Such details are included to facilitate understanding of the invention but should not limit the scope of the invention. For example, the sample wavelengths provided are typically used in communication systems, however other wavelengths may be used. Thus, the scope of the invention should only be limited by the limitations described in the claims that follow and its equivalents.

What is claimed is:

1. A highly transmissive sensor to determine the position of an optical beam comprising:

a highly transmissive sensor layer;

a highly transmissive conductor plate positioned over the sensor layer; and a highly transmissive substrate supporting the highly transmissive sensor layer and highly transmissive conductor plate, the highly transmissive sensor layer to determine the position of an optical beam passing through the highly transmissive sensor.

2. The highly transmissive sensor of claim 1 wherein:

the highly transmissive sensor is segmented such that the width of a segment is approximately equal to the width of the optical beam.

3. The highly transmissive sensor of claim 1 further comprising:

a segmented second highly transmissive sensor layer superimposed over the first highly transmissive sensor layer, the first highly transmissive sensor layer also segmented to form a first segmented highly transmissive sensor layer such that the overlap region between the first segmented highly transmissive sensor layer and the second segmented highly transmissive layer forms a series of approximately rectangular overlap regions.

4. The highly transmissive sensor of claim 1 wherein the highly transmissive sensor layer is a thin film semiconductor.

5. The highly transmissive sensor of claim 4 wherein the thin film semiconductor includes one of a group consisting of amorphous silicon, amorphous silicon-germanium alloy, an organic photoconductor or polycrystalline silicon.

6. The highly transmissive sensor of claim 1 wherein the highly transmissive sensor layer is divided into an array of pixel detectors.

7. The highly transmissive sensor of claim 6 wherein the sensor includes a plurality of transistors that allows active matrix addressing of each individual pixel detectors in the highly transmissive sensor.

8. The highly transmissive sensor of claim 7 wherein each pixel detector is coupled to a corresponding transistor in the plurality of transistor with a highly transmissive conducting wire.

9. The highly transmissive sensor of claim 1 wherein the highly transmissive sensor includes an amorphous silicon p-i-n diode.

10. The highly transmissive sensor of claim 1 wherein the conducting plate is formed form ITO.

11. A highly transmissive sensor to detect the position of an optical signal comprising:
    a highly transmissive substrate;
    a highly transmissive conductor plate;
    a first highly transmissive light detecting layer deposited over the highly transmissive substrate,
    a second highly transmissive light detecting layer, the second light detecting layer separated from the first highly transmissive light detecting layer by the highly transmissive conductor plate, the highly transmissive conductor plate to bias the first light detecting layer and the second light detecting layer to detect the position of an optical signal passing through the first light detecting layer, the second light detecting layer and the highly transmissive substrate, the combination of the highly transmissive substrate and the highly transmissive light detecting layer attenuating the intensity of the optical signal by less than 10 percent.

12. The highly transmissive sensor of claim 11 further comprising: a second conductor plate positioned on a second side of the first highly transmissive light detecting sensor layer, the second conductor to collect carriers generated by the optical signal passing through the light detecting layer and the highly transmissive substrate.

13. The highly transmissive sensor of claim 12 wherein the first and the second conductor plates are formed from indium tin oxide.

14. The highly transmissive sensor of claim 12 wherein the second conductor plate transports carriers to a set of parallel electrodes coupled to the second conductor.

15. The highly transmissive sensor of claim 12 further comprising:
    a third conductor plate positioned on a second side of the second highly transmissive light detecting sensor layer, the third conductor plate to carry current generated by the optical signal in the second highly transmissive light detecting layer.

16. The highly transmissive sensor of claim 15 further comprising:
    a first set of parallel electrodes coupled to the second conductor plate; and
    a second set of parallel electrodes coupled to the third conductor plate, the second set of parallel electrodes approximately perpendicularly oriented to the first set of parallel electrodes.

17. The highly transmissive sensor of claim 15 wherein the second conducting plate has a thickness and the optical signal has a frequency with a corresponding wavelength, the thickness equal to approximately one quarter of the wavelength.

18. The highly transmissive sensor of claim 11 wherein the light detecting layer includes amorphous silicon.

* * * * *